(12) United States Patent
Nachon et al.

(10) Patent No.: US 7,641,097 B2
(45) Date of Patent: Jan. 5, 2010

(54) MOVEABLE ARM ASSEMBLY FOR A WIRE BONDER

(75) Inventors: Beni Nachon, Qiriat-Ata (IL); Joseph M. Martin, Warminster, PA (US); John Randolph Simon, Haifa (IL)

(73) Assignee: Kulicke and Soffa Industries, Inc., Fort Washington, PA (US)

(*) Notice: Subject to any disclaimer, the term of this patent is extended or adjusted under 35 U.S.C. 154(b) by 130 days.

(21) Appl. No.: 11/868,584

(22) Filed: Oct. 8, 2007

(65) Prior Publication Data

US 2008/0083815 A1    Apr. 10, 2008

Related U.S. Application Data

(60) Provisional application No. 60/828,677, filed on Oct. 9, 2006.

(51) Int. Cl.
*B23K 37/00* (2006.01)
(52) U.S. Cl. ...................................... 228/4.5
(58) Field of Classification Search .................. 228/4.5
See application file for complete search history.

(56) References Cited

U.S. PATENT DOCUMENTS

| | | | | |
|---|---|---|---|---|
| 3,863,827 | A * | 2/1975 | Foulke et al. ................. | 228/4.5 |
| 4,475,681 | A * | 10/1984 | Ingle ........................... | 228/4.5 |
| 5,318,234 | A * | 6/1994 | Biggs et al. ............... | 242/420.6 |
| 6,382,494 | B1 * | 5/2002 | Miller ........................ | 228/1.1 |
| 2003/0102358 | A1 * | 6/2003 | Bowen ..................... | 228/180.5 |

OTHER PUBLICATIONS

"Hybond model 626", http://web.archive.org/web/20041204232500/www.hybond.com/html/626.htm, from Internet Archive Dated Dec. 4, 2004.*
Model 626 Mulipurpose Digital Thermosonic Wire Bonder, Ball Bonder, Wedge Bonder, Bump Bonder, Peg Bonder and more Hybond, Inc., Model 626 (http://www.hybond.com/pdf/626.pdf).
"4524 Ball Bonder" brochure. (http://www.kns.com/KNSNew/Templates/ShowPage.asp? TMID=108&FID=853&PID=3811) 2001, Kulicke and Soffa Industries, Inc.
West Bond Inc. 7400E-7600E-7700E Series, Manual Wire Bonders, Triple Convertible Machine. (http://www.westbond.com/fl_products.htm).
TPT, HB05, Wedge and Ball Bonder. (http://tpt.de/HB05_englisch.pdf).
"4700 Convertible Wire Bonder" Brochure. (http://kns.com/KNSNew/Templates/ShowPage.asp? TMID=86&FID=853 &PID=14872) 2007, Kulicke and Soffa Industries, Inc.

* cited by examiner

*Primary Examiner*—Jessica L. Ward
*Assistant Examiner*—Jacky Yuen
(74) *Attorney, Agent, or Firm*—Christopher M. Spletzer, Sr.

(57) ABSTRACT

A wire bonding machine includes a moveable arm assembly and at least one component for a ball bonding operation of the wire bonding machine supported by the moveable arm assembly. The moveable arm assembly is configured to move between a ball bonding position and a wedge bonding position. When the moveable arm assembly is in the ball bonding position the at least one component for the ball bonding operation is in a predetermined position for use in the ball bonding operation.

18 Claims, 10 Drawing Sheets

MOVEABLE ARM ASSEMBLY FOR A WIRE BONDER

CROSS-REFERENCE TO RELATED APPLICATION

This application claims the benefit of U.S. Provisional Application No. 60/828,677, filed Oct. 9, 2006, the contents of which are incorporated herein by reference.

FIELD OF THE INVENTION

The present invention relates to manual wire bonding machines, and more particularly, to wire bonding machines configured for ball bonding and wedge bonding.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

Manual wire bonding machines (in contrast to automatic wire bonding machines) are often purchased by low volume users, for example: universities, research and development teams, product development teams, etc. Therefore, it is often desirable that each such wire bonding machine be adaptable for as many variables as possible.

In particular, it is desirable that certain manual wire bonding machines be adaptable for use as a ball bonding machine or as a wedge bonding machine. As is known to those skilled in the art, ball bonding machines and wedge bonding machines utilize certain components that are the same, and certain components that are different. For example, a ball bonding machine utilizes an electronic flame-off device (e.g., an electrode or "wand") that is not used by a wedge bonding machine.

Conventionally, it is typical that two distinct machines would be used if both functions were desired. Prior attempts to use a single manual wire bonding machine as both a ball bonding machine and a wedge bonding machine resulted in certain complications. For example, in some prior attempts, certain components are removed/interchanged when using the machine in one mode versus the other. Alternatively, certain components used for both modes may be installed on the machine at all times, undesirably using valuable real estate on the machine and potentially being in the way of the machine operator.

Thus, it would be desirable to provide an improved wire bonding machine that accommodates both ball bonding and wedge bonding.

SUMMARY OF THE INVENTION

According to an exemplary embodiment of the present invention, a wire bonding machine is provided. The wire bonding machine includes a moveable arm assembly and at least one component for a ball bonding operation of the wire bonding machine supported by the moveable arm assembly. The moveable arm assembly is configured to move between a ball bonding position and a wedge bonding position. When the moveable arm assembly is in the ball bonding position the at least one component for the ball bonding operation is in a predetermined position for use in the ball bonding operation.

According to another exemplary embodiment of the present invention, a manual wire bonding machine is provided. The manual wire bonding machine includes a swinging arm assembly for rotating between a ball bonding position and a wedge bonding position. The manual wire bonding machine also includes an electronic flame off device configured for use during a ball bonding operation. The electronic flame off device is supported by the swinging arm assembly such that when the swinging arm assembly is in the ball bonding position the electronic flame off device is in a predetermined position for use in the ball bonding operation.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention relates to wire bonding machines and has particular applicability to manual wire bonding machines. Certain exemplary embodiments of the present invention relate to the use of a moveable arm assembly (e.g., a swinging or rotatable arm assembly) which moves between a ball bonding position and a wedge bonding position (e.g., the moveable arm assembly includes a moveable arm which moves certain components between the ball bonding position and the wedge bonding position). For example, the moveable arm assembly may support and properly position (i.e., support in a predetermined position) one or more components used in a ball bonding operation (but not used in a wedge bonding operation) when the moveable arm assembly is in the ball bonding position. Likewise, the moveable arm assembly may support and properly position (i.e., support in a predetermined position) one or more components used in a wedge bonding operation (but not used in a ball bonding operation) when the moveable arm assembly is in the wedge bonding position. Thus, a wire bonding machine (e.g., a manual wire bonding machine) is provided which allows for a quick changeover between ball bonding (sometimes referred to as "ball-wedge bonding" or "ball-stitch bonding") and wedge bonding (sometimes referred to as "wedge-wedge bonding").

According to an exemplary embodiment of the present invention, the moveable arm assembly is a swinging arm assembly which provides for this quick changeover from ball bonding to wedge bonding, and vice-versa. The swinging arm assembly includes a swinging arm that supports certain components that may be used only in one of ball bonding or wedge bonding (of course, components used in both ball bonding and wedge bonding may also be held by the swinging arm assembly). The swinging arm of the assembly is designed to rotate such that when it is rotated into a first position (e.g., the swinging arm assembly is in a ball bonding position), certain components utilized in ball bonding are brought into their proper (i.e., predetermined) position. When the swinging arm is rotated into a second position (e.g., the swinging arm assembly is in a wedge bonding position), certain components utilized in wedge bonding are brought into their proper (i.e., predetermined) position. Exemplary components that may be held by the swinging arm assembly are: (1) a wedge bonding wire spool holder; (2) ball bonding wire drag clamp(s) for providing tension to seat a free air ball in a capillary; (3) ball bonding electronic flame-off device (e.g., the electric discharge electrode used to form the ball in ball bonding); and (4) a micro switch to sense the swinging arm position (e.g., for the purpose of signaling the manual wire bonder machine to run a specific process, that is, ball bonding or wedge bonding), amongst others. Of course, different or additional components may be held by the swinging arm.

Figure 1:
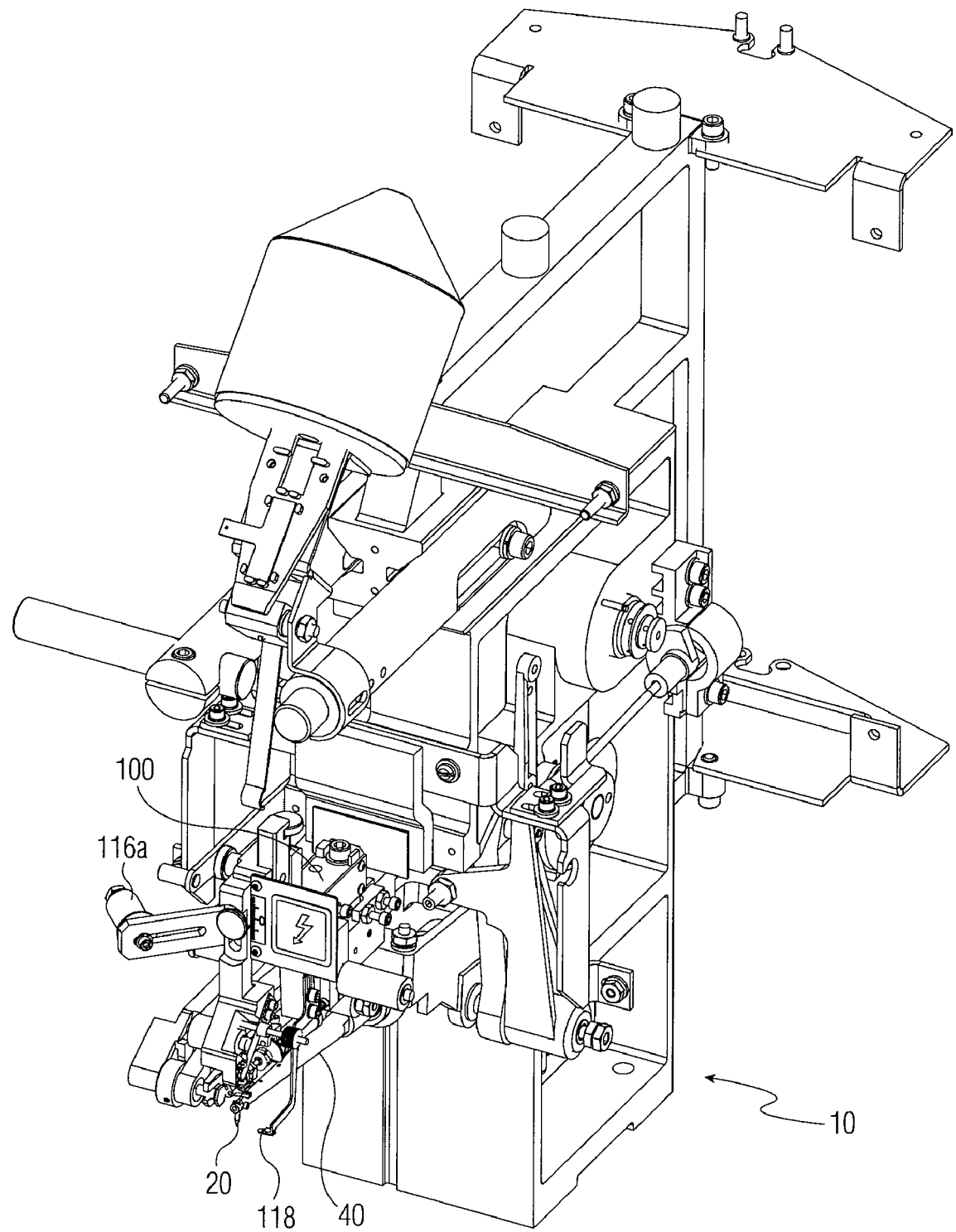
FIG. 1 is a perspective view of a manual wire bonding machine including a swinging arm assembly in a ball bonding position in accordance with an exemplary embodiment of the present invention.

FIG. 1 is a perspective view of manual wire bonding machine 10 (with certain components removed for clarity) including swinging arm assembly 100 in a ball bonding position in accordance with an exemplary embodiment of the present invention. Amongst other components to be discussed in greater detail below, swing arm assembly 100 supports electronic flame off device 118 and wire spool holder 116a. Wire bonding machine also includes transducer 40 which supports capillary tool 20. As indicated above, swinging arm assembly 100 is illustrated in a ball bonding position in FIG. 1, and as such, electronic flame off device 118 (which is supported by swinging arm assembly 100) is positioned in a predetermined position adjacent bonding tool 20 as is intended during a ball bonding operation.

Figure 2:
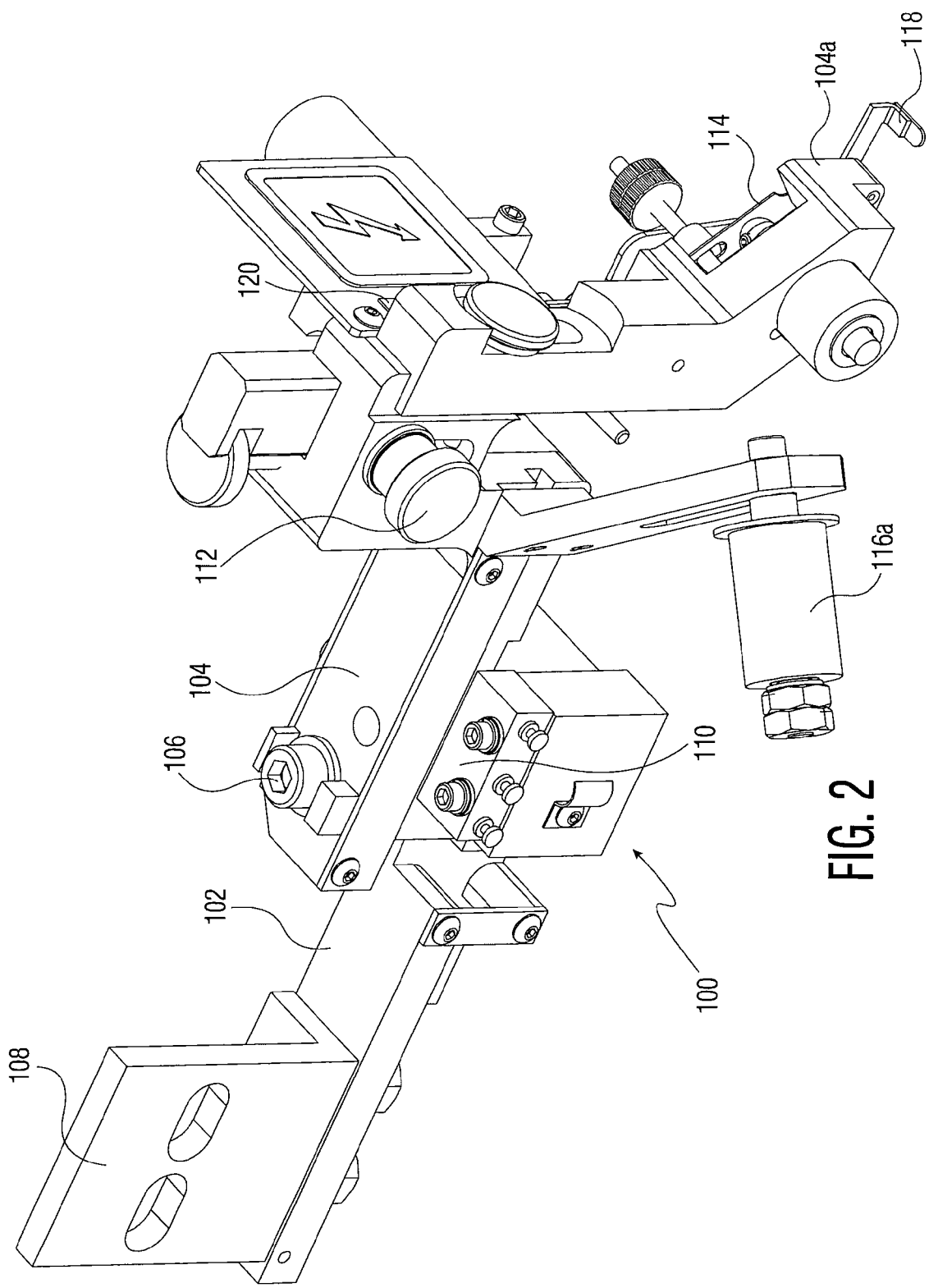
FIG. 2 is a perspective view of the swinging arm assembly of FIG. 1 in the ball bonding position in accordance with an exemplary embodiment of the present invention.
Figure 3:
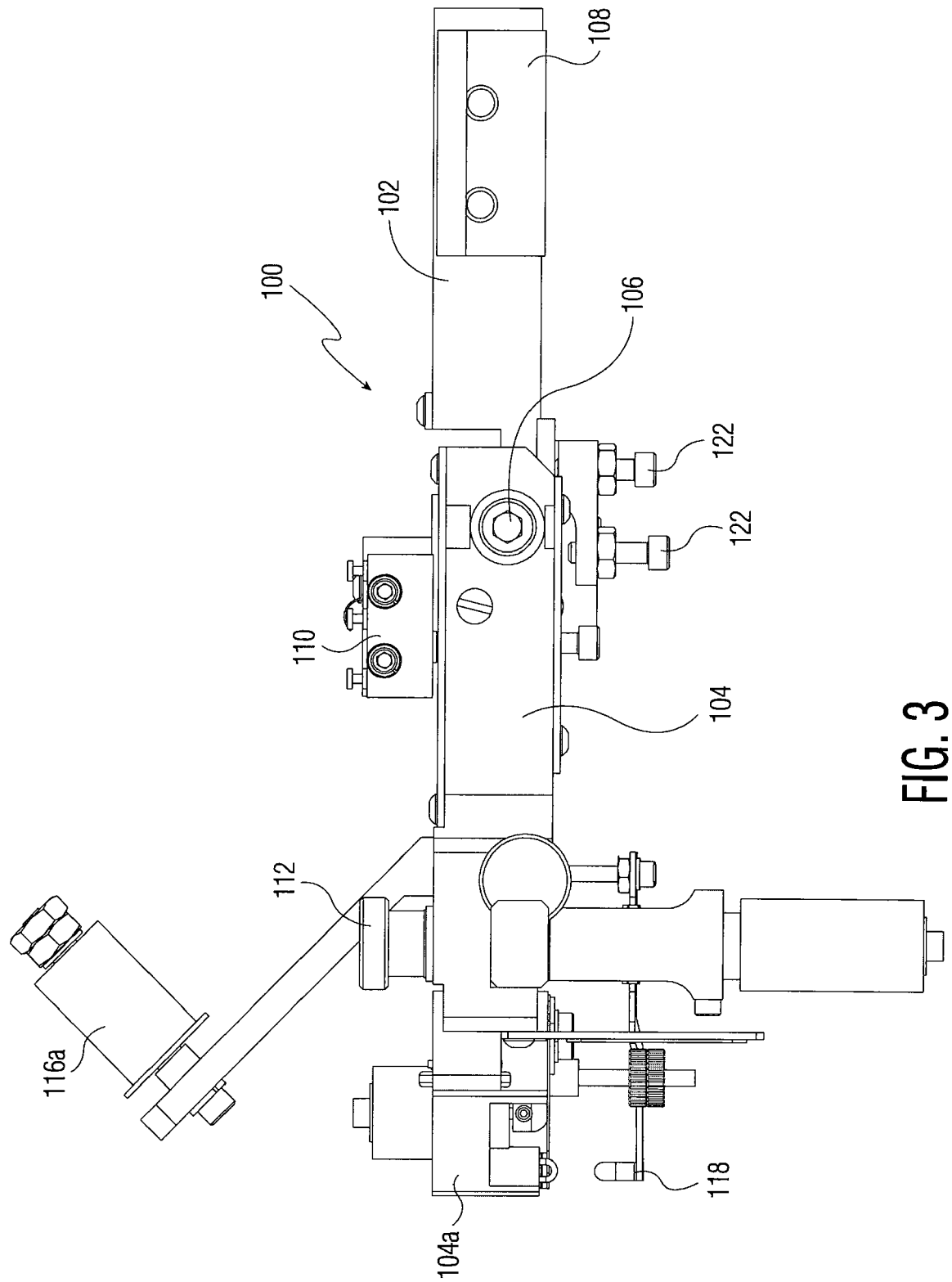
FIG. 3 is a top view of the swinging arm assembly of FIG. 1 in the ball bonding position in accordance with an exemplary embodiment of the present invention.

FIGS. 2-3 are perspective and top views, respectively, of swinging arm assembly 100, in the ball bonding position, separated from the remainder of manual wire bonding machine 10. Swinging arm assembly 100 includes support arm 102 and swinging arm 104. Support arm 102 is fixedly supported (e.g., through bracket 108 and fasteners or the like) by another portion of manual wire bonding machine 10, while swinging arm 104 rotates with respect to support arm 102 (and with respect to the remainder of the wire bonding machine) about pivot point 106 (e.g., pivoting hinge 106). This rotation is accomplished by rotating (e.g., manually rotating, rotating using a motor or the like, etc.) swinging arm 104 between a first position (e.g., the ball bonding position shown in FIGS. 1-3) and a second position (e.g., a wedge bonding position shown in FIGS. 4-6). As shown in FIGS. 1-3, portion 104a of swinging arm 104 support certain components for ball bonding (in a ball bonding position) including electronic flame-off electrode 118. Also shown in FIGS. 1-3 are: (1) micro switch 110 for sensing the swinging arm position (e.g., for the purpose of signaling the manual wire bonder machine to run a specific process, that is, ball bonding or wedge bonding); (2) electrode height adjustment screw 112; (3) wire drag clamp 114; (4) wedge bonding wire spool holder 116a; (5) wire path/holder 120; and (6) arm position fine ball adjustment 122.

After rotating swinging arm from one of the first position and the second position into the other of the first position and the second position, a locking mechanism may be used to lock the system in the selected position. For example, while not clearly illustrated in FIGS. 1-3, an internal locking mechanism may be provided. Such a locking mechanism may take any of a number of forms. One exemplary structure is a spring plunger (e.g., a ball-spring combination in which the ball runs along a path). When the ball of the spring plunger comes to either of a first point (the locked position for ball bonding) or the second point (the locked position for wedge bonding) the spring forces the ball into a locking location (e.g., a locking location such as a countersunk region configured to receive a portion of the ball of the spring plunger). Of course other locking structures are contemplated.

Figure 4:
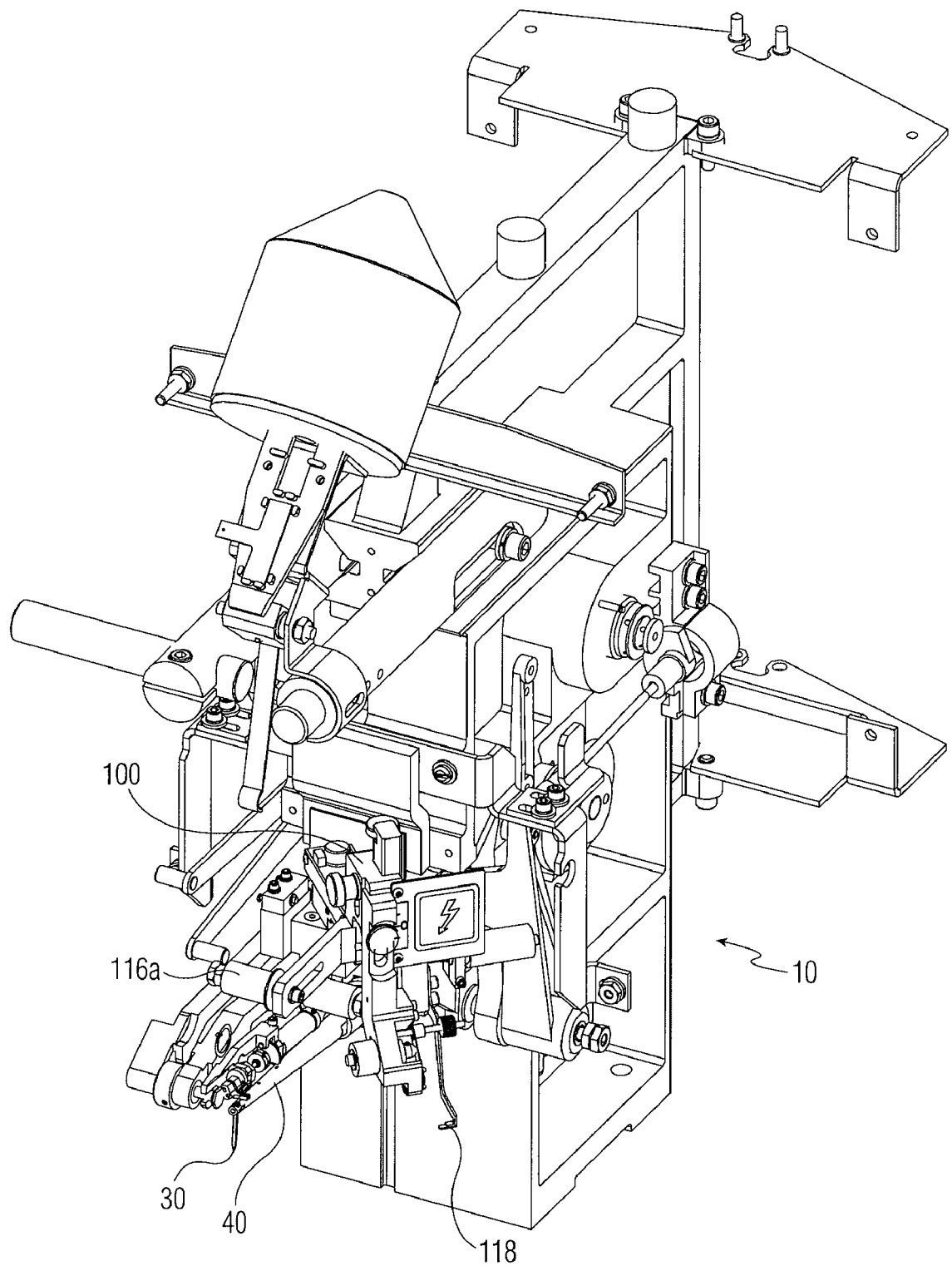
FIG. 4 is a perspective view of the manual wire bonding machine of FIG. 1 including a swinging arm assembly in a wedge bonding position in accordance with an exemplary embodiment of the present invention.
Figure 5:
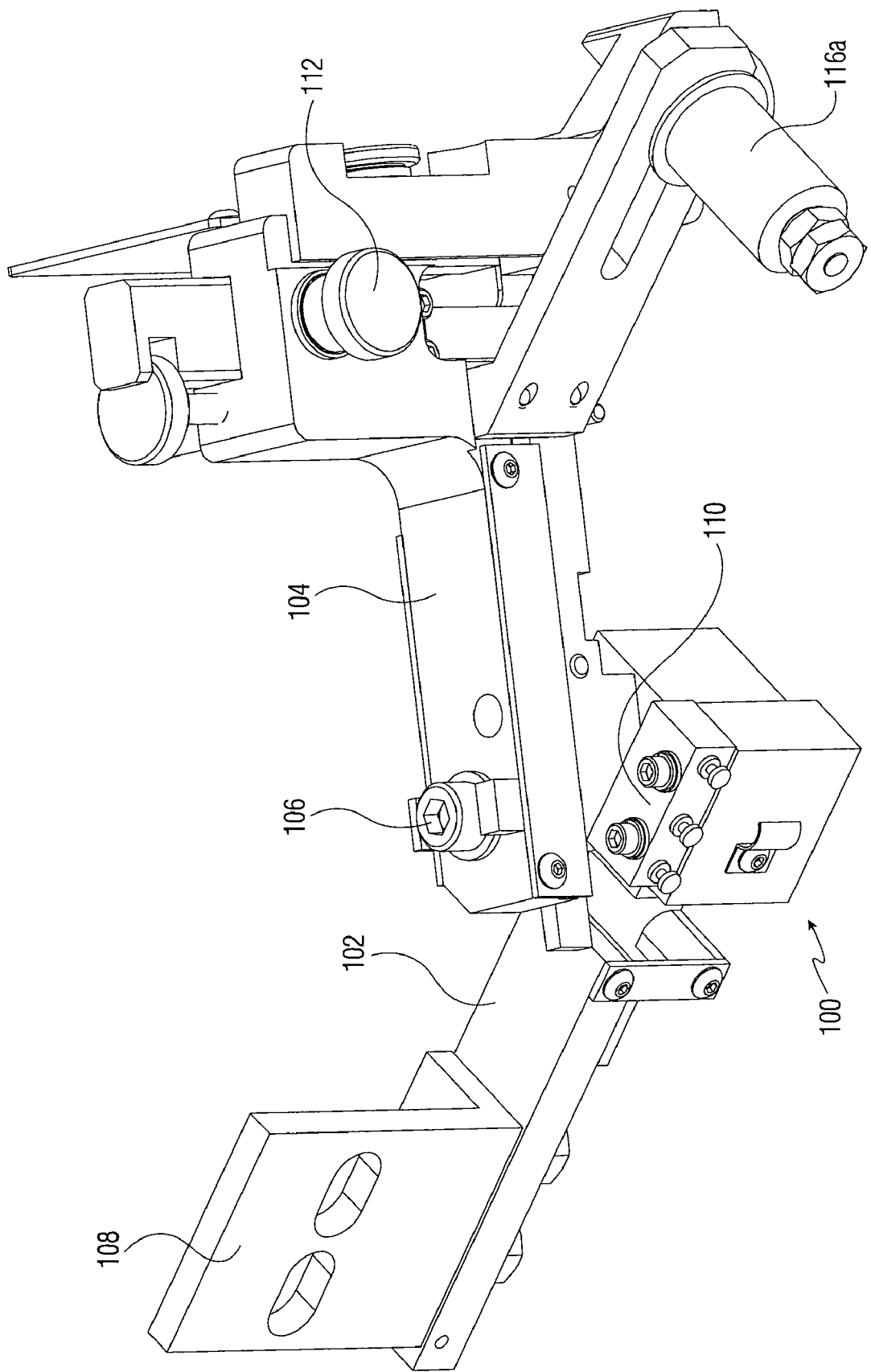
FIG. 5 is a perspective view of the swinging arm assembly of FIG. 4 in the wedge bonding position in accordance with an exemplary embodiment of the present invention.
Figure 6:
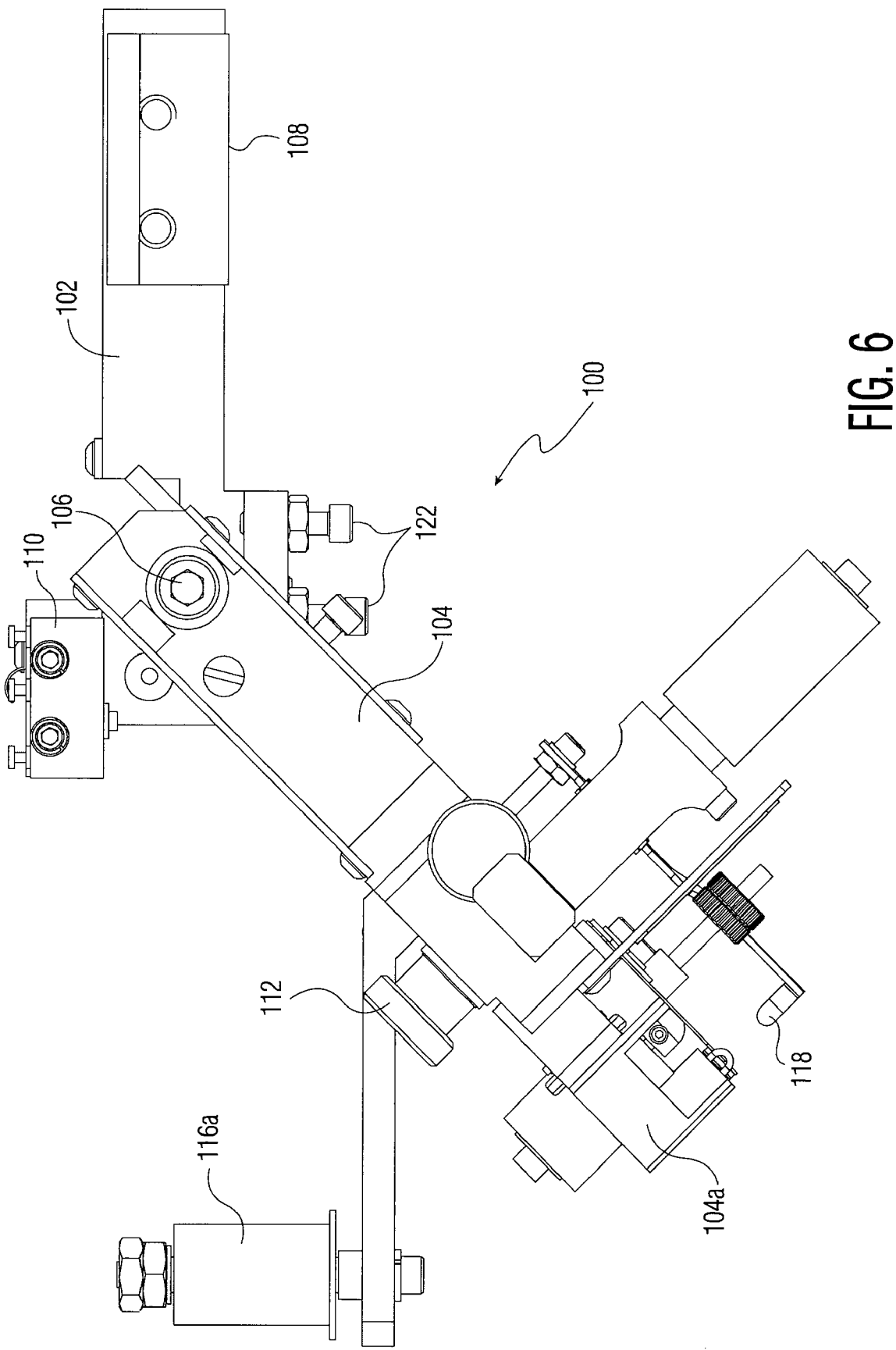
FIG. 6 is a top view of the swinging arm assembly of FIG. 4 in the wedge bonding position in accordance with an exemplary embodiment of the present invention.
Figure 7:
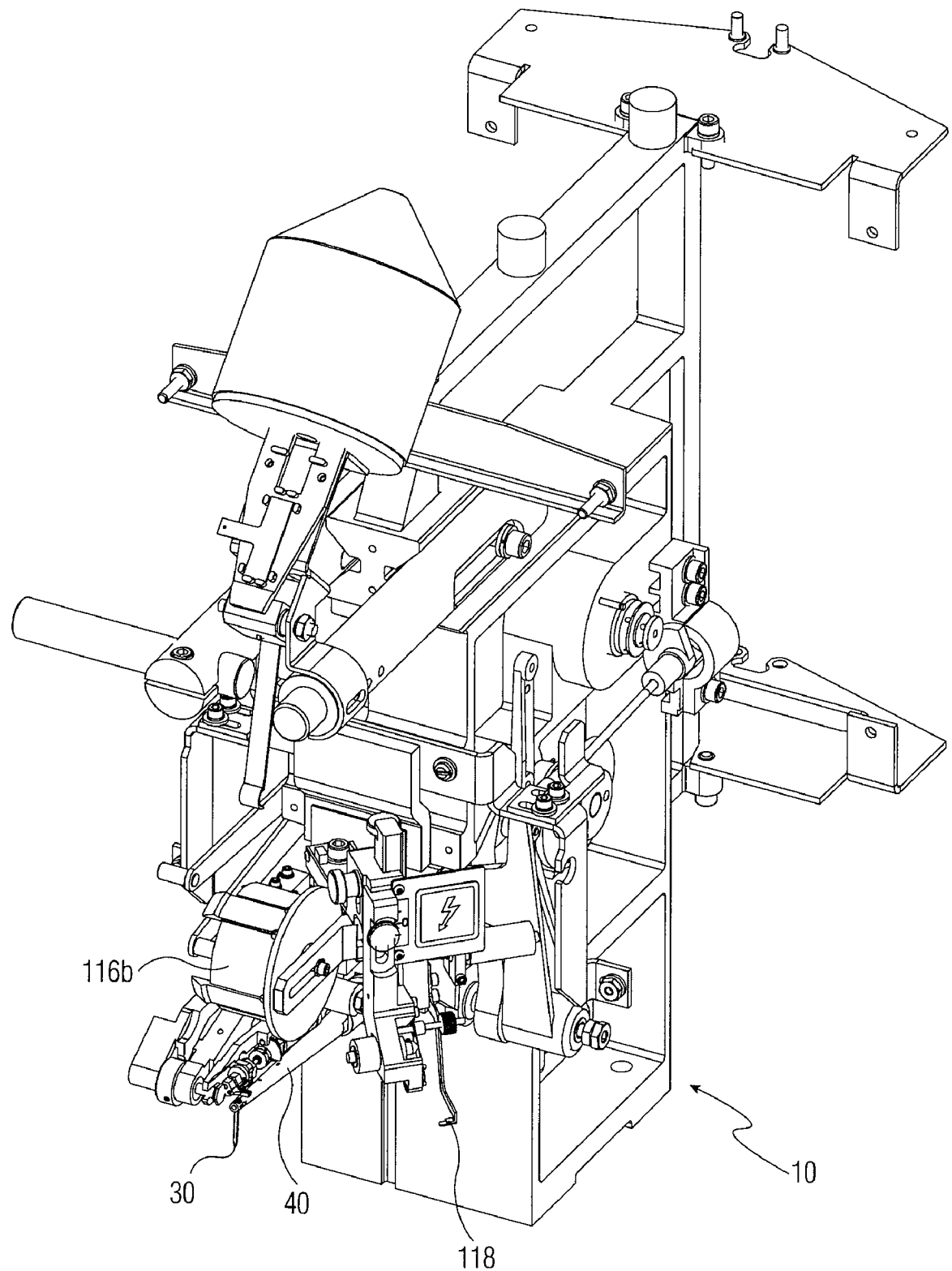
FIG. 7 is a perspective view of the manual wire bonding machine of FIG. 1 including a swinging arm assembly in a wedge bonding position and further including a wire spool adapter in accordance with an exemplary embodiment of the present invention.

In contrast to the ball bonding position of swinging arm assembly 100 shown in FIGS. 1-3, FIGS. 4-6 illustrate swinging arm assembly 100 in a wedge bonding position. Thus, as shown in FIG. 4, electronic flame off device 118 (i.e., a ball bonding component not used in wedge bonding) has been moved away from the bonding area, while wire spool holder 116a (i.e., a wedge bonding component not used in ball bonding) has been moved towards the bonding area (in contrast to the position of wire spool holder 116a shown in FIG. 1). As is clear from FIGS. 5-6, in the wedge bonding position, swinging arm 104 has been rotated about pivot point 106 such that swinging arm 104 is not "in line" with support arm 102 as in FIGS. 2-3.

In normal operation, a manual wire bonding machine operator selects one of two positions for swinging arm assembly 100 (e.g., one of the two types of bonding), and rotates swinging arm 104 into the desired position, and then locks swinging arm 104 into the desired position (of course, swinging arm 104 may automatically "lock" into position through rotation into the desired position). The machine reset logic may then be reset by, for example, triggering a power off/on cycle. The normal processes of the selected bonding mode (ball bonding or wedge bonding) may then be conducted.

Figure 8A:
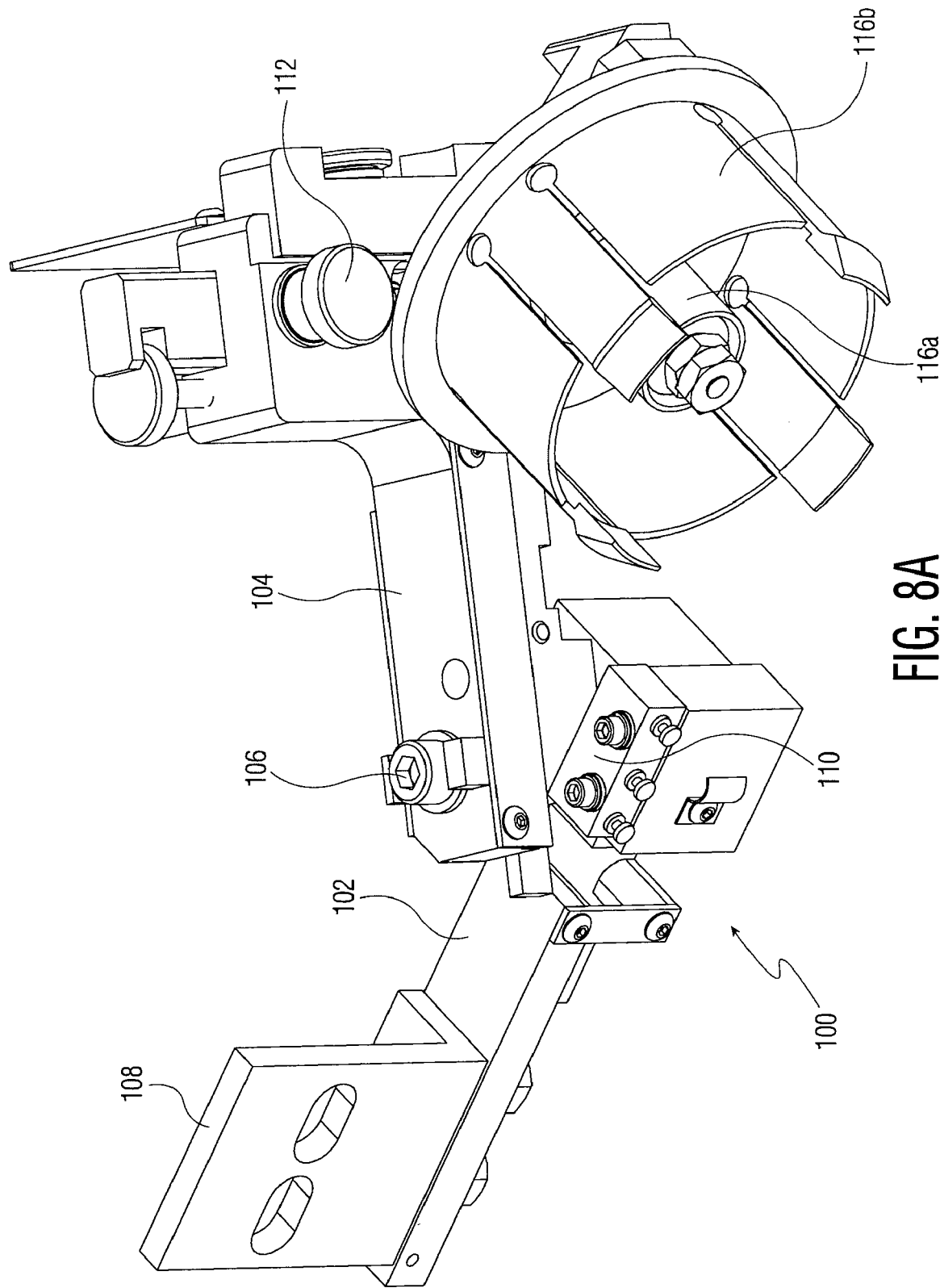
FIG. 8A is a perspective view of the swinging arm assembly of FIG. 7 in the wedge bonding position in accordance with an exemplary embodiment of the present invention.
Figure 8B:
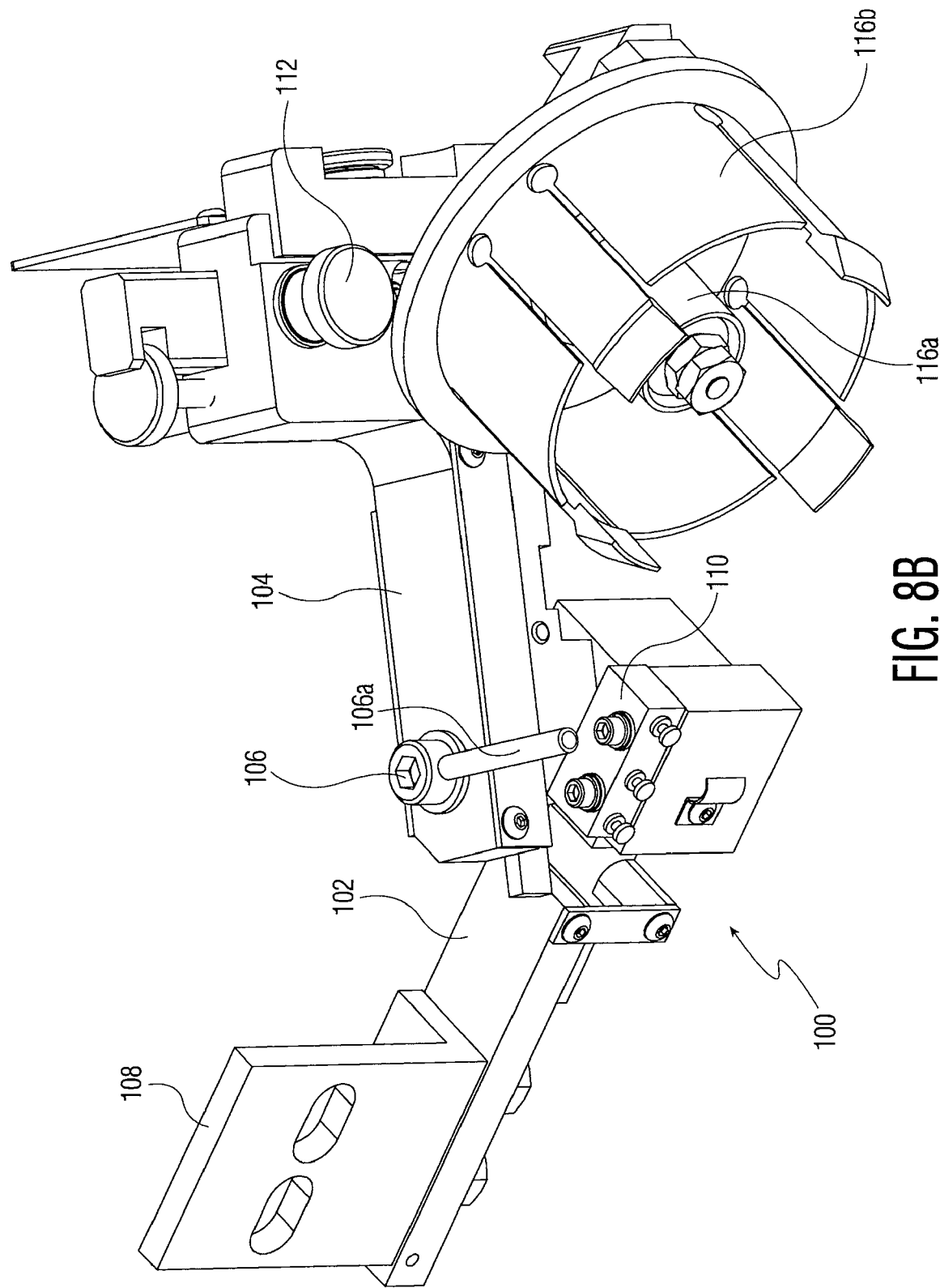
FIG. 8B is a perspective view of a swinging arm assembly similar to that shown in FIG. 7 in the wedge bonding position including a locking lever in accordance with an exemplary embodiment of the present invention.
Figure 9:
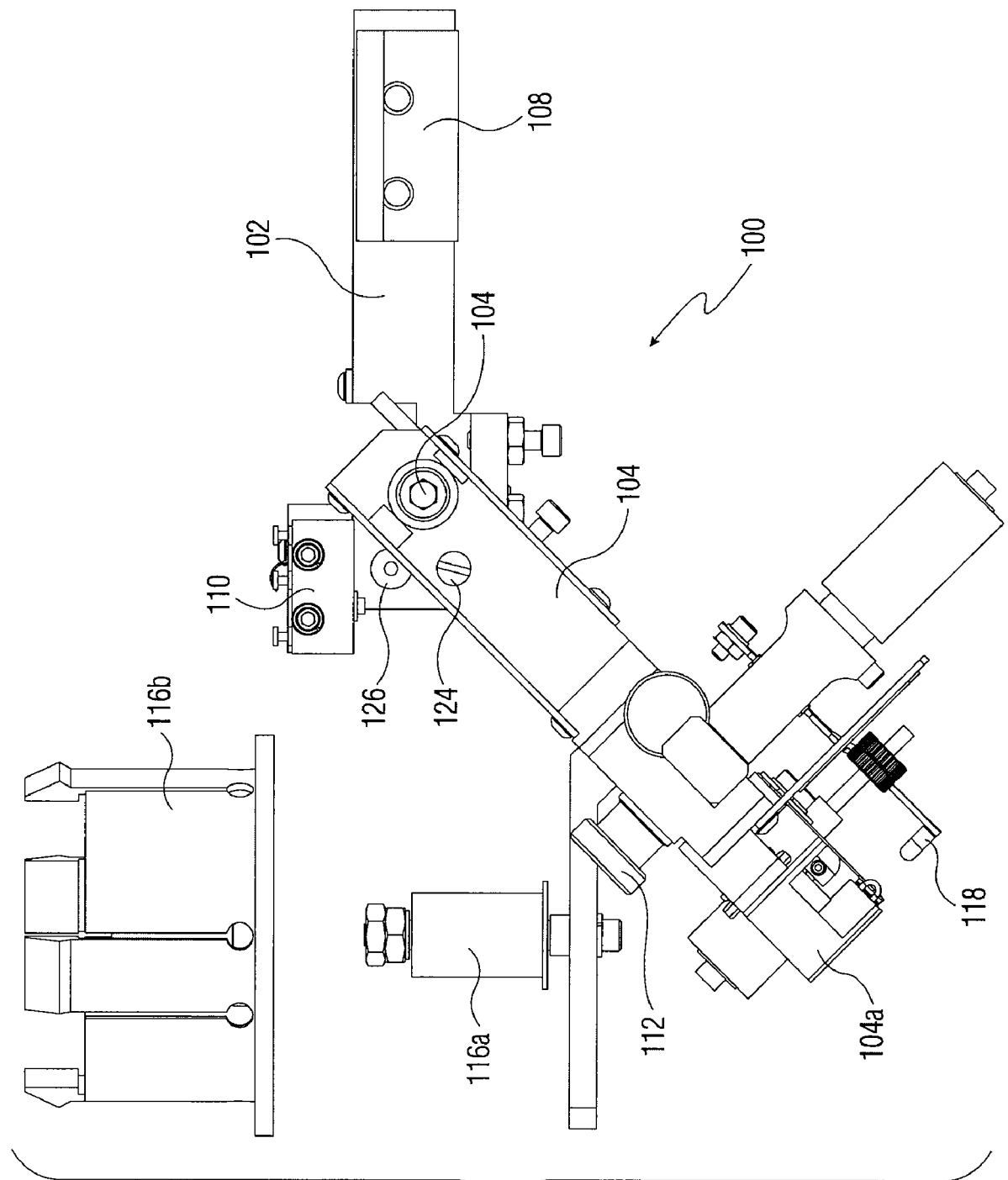
FIG. 9 is a top view of the swinging arm assembly of FIG. 7 in the wedge bonding position with the wire spool adapter removed in accordance with an exemplary embodiment of the present invention.

As illustrated in FIGS. 1-6, swinging arm assembly 100 supports wire spool holder 116a used for wedge bonding. For example, wire spool holder may be configured to accept a first sized wire spool (e.g., a ½ inch spool); however, in wedge bonding, it may sometimes be desirable to accommodate wire spools of different sizes. As such, in accordance with certain exemplary embodiments of the present invention, a wire spool size adapter is provided. For example, in FIGS. 7, 8A-8B, and 9, wire spool size adapter 116b is shown. Wire spool size adapter 116b is configured to fit (e.g., snap onto or otherwise connect to) over wire spool holder 116a. FIG. 9 is a top view of swinging arm assembly 100 which illustrates wire spool size adapter 116*b* separated from wire spool holder 116*a*. Wire spool size adapter 116*b* is configured to accept wire spools of a second size (e.g., 2 inch wire spools) that is different from the first sized wire spool which fits on wire spool holder 116*a*.

As provided above, various types of locking mechanisms may be used to "lock" the swinging arm of swinging arm assembly in the selected one of the ball bonding position or the wedge bonding position. Such locking mechanisms may operate "automatically" upon rotation of swinging arm assembly 100 into the selected one of the positions. For example, the locking spring plunger described above may be considered to operate "automatically." Referring specifically to FIG. 9, locking plunger 124 is used to lock swinging arm 104 of swinging arm assembly 100 into the selected position (i.e., either the ball bonding position or the wedge bonding position). More specifically, when reaching the ball bonding position, locking plunger 124 plunges (through a spring action) into locating countersink cup 126 which locks swinging arm 104 in place (as is clear from viewing FIG. 9, countersink cup 126 for the ball bonding position is shown, while the countersink cup for the wedge bonding position is not visible). Releasing swinging arm 104 from being locked in the ball bonding position may be done by the operator rotating swinging arm 104 towards the wedge bonding position while using such a force that locking plunger 124 slips out of countersink cup 126.

As opposed to an "automatic" locking action, in certain alternative exemplary embodiments of the present invention, an affirmative act on the part of an operator may be used to actuate a locking mechanism. For example, FIG. 8B illustrates locking lever 106*a* which may be used by an operator to lock swinging arm 104 of swinging arm assembly 100 into the selected position. More specifically, locking lever 102 may be rotated (e.g., 90 degrees) to lock or unlock the system after the swinging arm is in the desired position (e.g., a ball bonding position or a wedge bonding position). In other respects (i.e., other than the locking mechanism), FIG. 8B is the same as the view shown in FIG. 8A.

As provided herein, in accordance of the present invention, a quick and efficient change-over system is provided for a manual wire bonding machine, allowing all (or substantially all) hardware for ball bonding and wedge bonding to be attached to the machine at all times, making wire bonding process selection practical without tools and/or parts swapping.

While certain exemplary devices are illustrated and described herein, it is contemplated that other devices may perform similar functions within the scope of the present invention. For example: (1) other types of locking mechanisms are contemplated other than those disclosed herein; (2) other types of pivoting mechanisms are contemplated besides pivot point/hinge 106; and (3) other types of support structures are contemplates besides support arm 102 and swinging arm 104, etc.

Although the moveable arm assembly has been illustrated and described herein primarily with respect to a rotatable swinging arm assembly, it is not limited thereto. For example, alternative moveable arm assemblies are contemplated (i.e., not rotatably moveable) such as assemblies configured for linear motion (vertical, horizontal, etc.) and angular motion to move between a ball bonding position and a wedge bonding position.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding machine comprising:
   a transducer configured to support a bonding tool;
   a moveable arm assembly having a range of motion between (1) a ball bonding position of the moveable arm assembly, and (2) a wedge bonding position of the moveable arm assembly, the moveable arm assembly being positioned in the ball bonding position during formation of wire loops using ball-stitch bonding, the moveable arm assembly being positioned in the wedge bonding position during formation of wire loops using wedge-wedge bonding, the motion of the moveable arm assembly being independent of the transducer and the bonding tool such that the transducer and bonding tool do not travel with the moveable arm assembly;
   at least one ball bonding component used in connection with the ball-stitch bonding being supported by the moveable arm assembly, the at least one ball bonding component being in a first predetermined position for the ball-stitch bonding when the moveable arm assembly is in the ball bonding position; and
   at least one wedge bonding component used in connection with the wedge-wedge bonding being supported by the moveable arm assembly, the at least one wedge bonding component being in a second predetermined position for the wedge-wedge bonding when the moveable arm assembly is in the wedge bonding position;
   wherein the at least one ball bonding component includes an electronic flame off device and wherein the at least one wedge bonding component includes a wire spool holder.

2. The wire bonding machine of claim 1 wherein the at least one ball bonding component also includes at least one of a portion of a wire path for the ball bonding operation, a ball bonding wire drag clamp, and a micro switch to sense the position of the moveable arm assembly.

3. The wire bonding machine of claim 1 wherein the wire spool holder is configured to accept a first wire spool size, and is configured to be adapted to accept a second wire spool size that is different from the first wire spool size.

4. The wire bonding machine of claim 3 further comprising a wire spool size adapter for converting the wire spool holder to accept the second wire spool size.

5. The wire bonding machine of claim 3 wherein the first wire spool size is ½ inch and the second wire spool size is 2 inches.

6. The wire bonding machine of claim 1 wherein the moveable arm assembly is configured to rotate between the ball bonding position and the wedge bonding position.

7. The wire bonding machine of claim 1 further comprising a locking mechanism for locking the moveable arm assembly into a selected one of the ball bonding position or the wedge bonding position.

8. The wire bonding machine of claim 7 wherein the locking mechanism includes a rotatable locking lever.

9. The wire bonding machine of claim 1 further comprising a sensing mechanism for sensing whether the moveable arm assembly is in the ball bonding position or the wedge bonding position.

10. A manual wire bonding machine comprising:
    a transducer configured to support a bonding tool;
    a swinging arm assembly for rotating between (1) a ball bonding position of the swinging arm assembly, and (2) a wedge bonding position of the swinging arm assembly, the swinging arm assembly being positioned in the ball bonding position during formation of wire loops using ball-stitch bonding, the swinging arm assembly being positioned in the wedge bonding position during formation of wire loops using wedge-wedge bonding, the motion of the swinging arm assembly being independent of the transducer and the bonding tool such that the transducer and bonding tool do not travel with the swinging arm assembly;

an electronic flame off device used in connection with the ball-stitch bonding being supported by the swinging arm assembly, the electronic flame off device being in a first predetermined position for the ball-stitch bonding when the swinging arm assembly is in the ball bonding position; and at least one wedge bonding component used in connection with the wedge-wedge bonding being supported by the swinging arm assembly, the at least one wedge bonding component being in a second predetermined position for the wedge-wedge bonding when the moveable arm assembly is in the wedge bonding position;

wherein the at least one wedge bonding component includes a wire spool holder.

11. The manual wire bonding machine of claim 10 wherein the swinging arm assembly also supports at least one additional component for a ball bonding operation whereby when the swinging arm assembly is in the ball bonding position the at least one additional component for the ball bonding operation is in a predetermined position for use in the ball bonding operation, the at least one additional component for a the ball bonding operation includes at least one of a portion of a wire path for the ball bonding operation, a ball bonding wire drag clamp, and a micro switch to sense the position of the swinging arm assembly.

12. The manual wire bonding machine of claim 11 wherein the at least one additional component for the ball bonding operation is a ball bonding wire drag clamp.

13. The manual wire bonding machine of claim 10 wherein the wire spool holder is configured to accept a first wire spool size, and is configured to be adapted to accept a second wire spool size that is different from the first wire spool size.

14. The manual wire bonding machine of claim 13 further comprising a wire spool size adapter for converting the wire spool holder to accept the second wire spool size.

15. The manual wire bonding machine of claim 13 wherein the first wire spool size is ½ inch and the second wire spool size is 2 inches.

16. The manual wire bonding machine of claim 10 further comprising a locking mechanism for locking the swinging arm assembly into a selected one of the ball bonding position or the wedge bonding position.

17. The manual wire bonding machine of claim 16 wherein the locking mechanism includes a rotatable locking lever.

18. The manual wire bonding machine of claim 10 further comprising a sensing mechanism for sensing whether the swinging arm assembly is in the ball bonding position or the wedge bonding position.

* * * * *